(12) United States Patent
Bosboom et al.

(10) Patent No.: US 11,059,187 B2
(45) Date of Patent: *Jul. 13, 2021

(54) APPARATUS, SYSTEM AND METHOD FOR PROVIDING A VACUUM EJECTOR FOR AN END EFFECTOR

(71) Applicant: JABIL INC., St. Petersburg, FL (US)

(72) Inventors: Jeroen Bosboom, St. Petersburg, FL (US); Daniel Bateman, St. Petersburg, FL (US); Michael Callahan, St. Petersburg, FL (US)

(73) Assignee: JABIL INC., St. Petersburg, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/697,271

(22) Filed: Nov. 27, 2019

(65) Prior Publication Data

US 2020/0206953 A1 Jul. 2, 2020

Related U.S. Application Data

(63) Continuation of application No. 16/127,701, filed on Sep. 11, 2018, now Pat. No. 10,493,638, which is a continuation of application No. 15/414,208, filed on Jan. 24, 2017, now Pat. No. 10,099,387.

(51) Int. Cl.
*B25J 15/06* (2006.01)
*H01L 21/683* (2006.01)

(52) U.S. Cl.
CPC ....... *B25J 15/0666* (2013.01); *B25J 15/0683* (2013.01); *H01L 21/6838* (2013.01)

(58) Field of Classification Search
CPC ............... B25J 15/0052; B25J 15/0616; B25J 15/0666; B25J 15/0683; B25J 15/065; H01L 21/6838
See application file for complete search history.

(56) References Cited

U.S. PATENT DOCUMENTS

| | | | | |
|---|---|---|---|---|
| 3,558,171 A | * | 1/1971 | Netsch et al. | ........ B66C 1/0212 294/186 |
| 3,973,682 A | * | 8/1976 | Neff | ..................... H01L 21/6838 414/627 |
| 4,473,247 A | * | 9/1984 | Itemadani | .............. B65G 47/91 29/740 |

(Continued)

*Primary Examiner* — Dean J Kramer
(74) *Attorney, Agent, or Firm* — Thomas J. McWilliams; Barnes & Thornburg LLP

(57) ABSTRACT

An apparatus, system and method for providing a vacuum ejector for use with an end effector. Included may be at least an end effector and a vacuum chamber for gripping an element during semiconductor processing. The end effector may include at least two clamp arms for placing a gripped element in relation to application of a vacuum to the gripped element; a vacuum cup having a mouth capable of sealing to the gripped element to provide a vacuum chamber; a vacuum ejector pin extending into the vacuum chamber and including a plurality of ports substantially at a tip thereof proximate to the gripped element, wherein the vacuum is applied by the plurality of ports; and an ejector pin actuator that is capable of moving the vacuum ejector pin toward the gripped element until the sealing of the mouth is broken and the gripped element is ejected from the vacuum cup.

15 Claims, 6 Drawing Sheets

(56) References Cited

U.S. PATENT DOCUMENTS

| | | | | |
|---|---|---|---|---|
| 4,950,011 A * | 8/1990 | Borcea | ............... | H05K 13/0413 294/2 |
| 4,995,662 A * | 2/1991 | Hawkswell | ............. | B65G 47/91 294/188 |
| 5,207,465 A * | 5/1993 | Rich | .................... | B65G 47/917 294/2 |
| 5,456,510 A * | 10/1995 | Coots | ................. | H05K 13/0409 294/183 |
| 6,000,122 A * | 12/1999 | Uchida | .............. | H05K 13/0409 29/740 |
| 6,065,789 A * | 5/2000 | Nagai | .................... | B41F 21/06 294/185 |
| 6,131,973 A * | 10/2000 | Trudeau | ............... | B25J 15/0616 294/186 |
| 7,207,139 B2 * | 4/2007 | McKinnis | ............ | A01C 11/00 47/57.6 |
| 7,618,074 B2 * | 11/2009 | Zimmer | ............. | G01R 31/2893 294/183 |
| 8,070,200 B2 * | 12/2011 | Shen | .................. | B24B 13/0031 294/184 |
| 9,138,900 B2 * | 9/2015 | Wang | .................... | B25J 15/0633 |
| 10,099,387 B2 * | 10/2018 | Bosboom | ............. | B25J 15/0616 |
| 10,493,638 B1 * | 12/2019 | Bosboom | .......... | H01L 21/68707 |
| 2016/0176056 A1 * | 6/2016 | Bentrim | ............... | B25J 15/0633 294/183 |

* cited by examiner

APPARATUS, SYSTEM AND METHOD FOR PROVIDING A VACUUM EJECTOR FOR AN END EFFECTOR

CROSS REFERENCE TO RELATED APPLICATION

The present application is a continuation application of U.S. Non-Provisional application Ser. No. 16/127,701, filed Sep. 11, 2018, entitled Apparatus, System and Method for Providing a Vacuum Ejector for an end Effector, which is a continuation application of U.S. Non-Provisional application Ser. No. 15/414,208, filed Jan. 24, 2017, entitled Apparatus, System and Method for Providing a Vacuum Ejector for an End Effector, the entireties of which are incorporated here by reference.

BACKGROUND

Field of the Disclosure

The present disclosure relates to the transfer of articles and, more particularly, relates to a vacuum ejector, such as may be used in association with an end effector for use in semiconductor processing.

Description of the Background

The use of robotics is well established as a manufacturing expedient, particularly in applications where human materials handling is inefficient and/or undesirable. One such circumstance is in the semiconductor arts, in which robotics are used to handle elements during various processing steps. Such process steps may include, by way of example, chemical mechanical planarization (CMP), etching, deposition, passivation, and various other processes in which a sealed and/or "clean" environment is typically maintained, such as to limit the likelihood of contamination and meet various specific processing conditions.

Such element handling may include using an end effector operably attached to robotic mechanism, such as to load semiconductor elements for the aforementioned exemplary process steps. That is, robotics may be employed to deploy one or more end effectors to retrieve elements for processing from a particular port or stack, such as before and/or after processing in an associated process chamber. The elements may thus be shuttled by the robotics using end effector(s) for processing. When processing stages are complete, the robotics may also be used to shuttle elements using end effector(s), such as to return processed elements to a loading port for further processing by the system.

Typical end effectors hold elements for processing using suction provided by, for example, vacuum draw(s). This vacuum draw may be singular or multiple in number. However, association of an element with a vacuum draw, and particularly disassociation of the element with a vacuum draw, is inefficient or ineffective. It goes without saying that such inefficiencies or ineffectiveness may damage the element being subjected to semiconductor processes, and/or may cause the exposure of the element to the semiconductor processes to be inadequate to develop the element.

SUMMARY

The disclosed embodiments are and include at least an apparatus, system and method for providing a vacuum ejector for use with an end effector. The apparatus, system and method may include at least an end effector and a vacuum chamber for gripping an element during semiconductor processing. The end effector may include at least two clamp arms for placing a gripped element in relation to application of a vacuum to the gripped element; a vacuum cup having a mouth capable of sealing to the gripped element to provide a vacuum chamber that enables the application of the vacuum to the gripped element; a vacuum ejector pin extending into the vacuum chamber and including a plurality of ports substantially at a tip thereof proximate to the gripped element, wherein the vacuum is applied by the plurality of ports upon the sealing of the mouth to the gripped element; and an ejector pin actuator that is capable of moving the vacuum ejector pin toward the gripped element through the vacuum chamber in the y-axis until the sealing of the mouth is broken and the gripped element is ejected from the vacuum cup.

In certain embodiments, the vacuum cup may be substantially pliable. The plurality of ports may consist of two or four ports, by way of non-limiting example. The ejector pin actuator may be, for example, a spring.

The vacuum chamber may be for inclusion on an end effector. The vacuum chamber may include a vacuum cup having a mouth capable of sealing to a gripped element to apply vacuum to the gripped element; a vacuum ejector pin extending through the vacuum cup and including a plurality of ports substantially at a tip thereof proximate to the gripped element, wherein the vacuum is applied by the plurality of ports upon the sealing of the mouth to the gripped element; and an ejector pin actuator that is capable of moving the vacuum ejector pin toward the gripped element in the y-axis until the mouth seal is broken and the gripped element is ejected from the vacuum cup.

Thus, the embodiments provide at least a vacuum ejector for use with end effectors that provides improved disassociation between the vacuum and the element being processed.

BRIEF DESCRIPTION OF THE DRAWINGS

The exemplary compositions, systems, and methods shall be described hereinafter with reference to the attached drawings, which are given as non-limiting examples only, in which.

DETAILED DESCRIPTION

Figure 1:
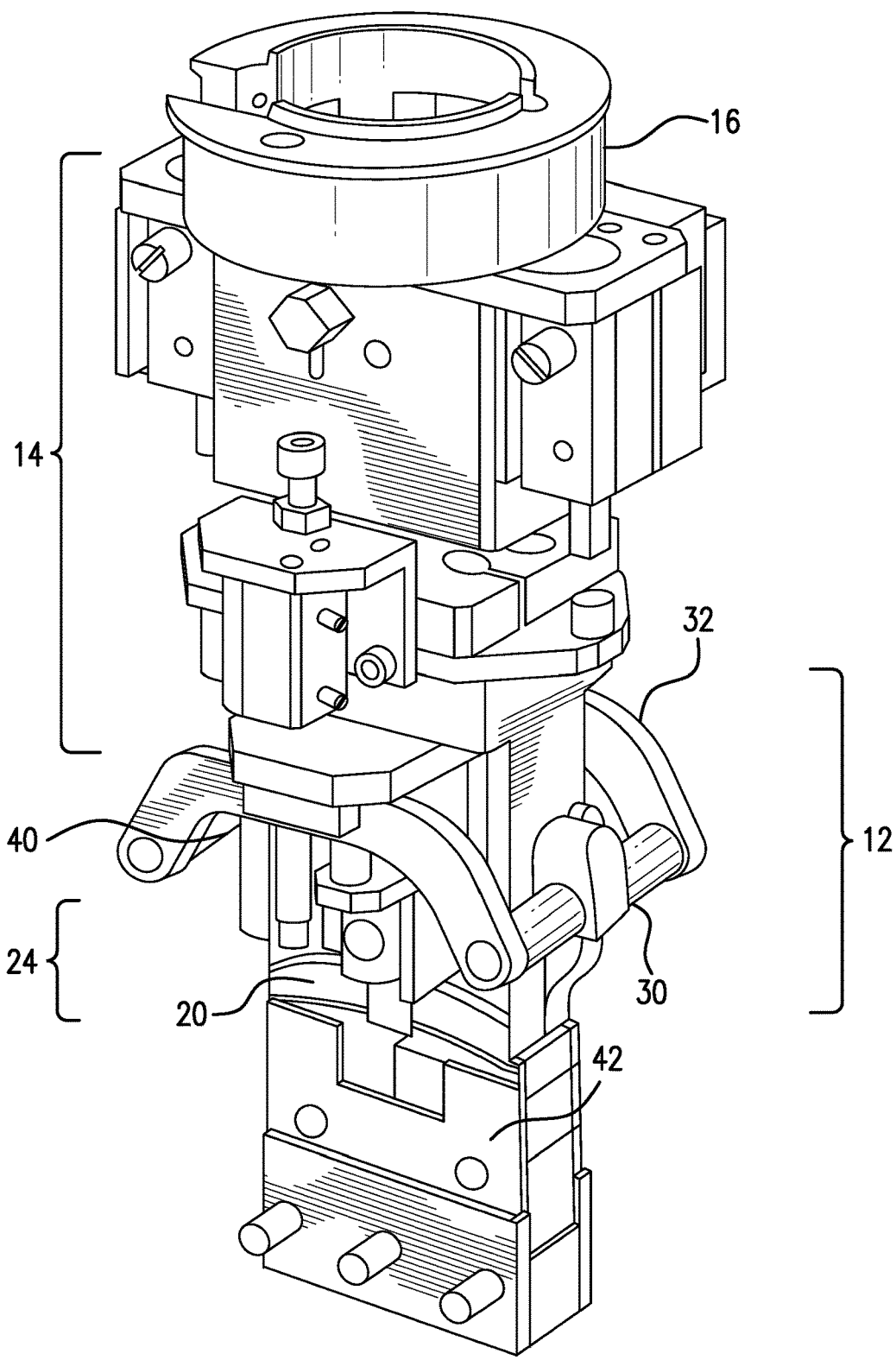
FIG. 1 is an illustration of an exemplary end effector.

The figures and descriptions provided herein may have been simplified to illustrate aspects that are relevant for a clear understanding of the herein described apparatuses, systems, and methods, while eliminating, for the purpose of clarity, other aspects that may be found in typical similar devices, systems, and methods. Those of ordinary skill may thus recognize that other elements and/or operations may be desirable and/or necessary to implement the devices, systems, and methods described herein. But because such elements and operations are known in the art, and because they do not facilitate a better understanding of the present disclosure, for the sake of brevity a discussion of such elements and operations may not be provided herein. However, the present disclosure is deemed to nevertheless include all such elements, variations, and modifications to the described aspects that would be known to those of ordinary skill in the art.

Embodiments are provided throughout so that this disclosure is sufficiently thorough and fully conveys the scope of the disclosed embodiments to those who are skilled in the art. Numerous specific details are set forth, such as examples of specific components, devices, and methods, to provide a thorough understanding of embodiments of the present disclosure. Nevertheless, it will be apparent to those skilled in the art that certain specific disclosed details need not be employed, and that embodiments may be embodied in different forms. As such, the disclosed embodiments should not be construed to limit the scope of the disclosure. As referenced above, in some embodiments, well-known processes, well-known device structures, and well-known technologies may not be described in detail.

The terminology used herein is for the purpose of describing particular embodiments only and is not intended to be limiting. For example, as used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The steps, processes, and operations described herein are not to be construed as necessarily requiring their respective performance in the particular order discussed or illustrated, unless specifically identified as a preferred or required order of performance. It is also to be understood that additional or alternative steps may be employed, in place of or in conjunction with the disclosed aspects.

When an element or layer is referred to as being "on", "upon", "connected to" or "coupled to" another element or layer, it may be directly on, upon, connected or coupled to the other element or layer, or intervening elements or layers may be present, unless clearly indicated otherwise. In contrast, when an element or layer is referred to as being "directly on," "directly upon", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). Further, as used herein the term "and/or" includes any and all combinations of one or more of the associated listed items.

Yet further, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another element, component, region, layer or section. Thus, terms such as "first," "second," and other numerical terms when used herein do not imply a sequence or order unless clearly indicated by the context. Thus, a first element, component, region, layer or section discussed below could be termed a second element, component, region, layer or section without departing from the teachings of the embodiments.

Certain embodiments of the present invention are and/or include an end effector with a vacuum ejector. In certain embodiments an end effector may be, for example, a SGE (specialty grip effector)-type end effector with one or more vacuum draws. Such an end effector may accommodate elements and devices having specialized sizes and/or shaped that are to be subjected to semiconductor processes in which those elements or devices are to be moved between processing stations under vacuum. In fact, in certain of these embodiments, the shape of such devices may necessitate that those devices be placed under vacuum in order to be moved about while avoiding contamination, such as may be provided from atop the element by the one or more vacuum draws. To avoid inefficiencies in moving these elements between processes, such as ineffective disassociation of the elements with the vacuum draw(s), it is advantageous to provide a mechanism whereby a specialized element may be efficiently "ejected" from the vacuum draw by which it is held to the end effector. According to certain embodiments of the present invention such a vacuum ejection function may be provided by a vacuum ejector quill.

FIG. 1 illustrates an exemplary embodiment of an end effector 10. End effector 10 illustrated in FIG. 1 may be a SGE end effector, and may be provided with shell tooling 12, as will be understood to the skilled artisan. However, the disclosed embodiments are not limited to the type of end effector illustrated in FIG. 1, nor are they limited to the specialty element or device, or the tooling associated therewith, illustrated in the example of FIG. 1.

In the illustrated embodiment of FIG. 1, end effector 10 includes an end effector body 14 integral with a robotics interface 16. Robotics interfaced to the robotics interface 14 may, for example, provide movement of the end effector 10, such as between semiconductor processing stations. A gripped element 20, such as the curved shell element shown in FIG. 1, may be subjected to vacuum as the gripped element 20 is moved between processing stations. Those skilled in the art will appreciate, in light of the discussion herein, that many types of specialized elements 20 held by many types of end effectors 10 may benefit from the use of the vacuum ejector of the disclosed embodiments.

Further illustrated in FIG. 1, by way of example only, are specialized end effector elements 24 provided for the illustratively shown curved shell element 20. In the illustrated case of FIG. 1, end effector 10 include clamps 30, such as synchronous clamps, which may be suitable to center the shell element 20 in one or more axes. A synchronous swing 32 may be provided in association with the end effector body in order to link various aspects, such as the synchronous clamps 30 and/or other dual control clamps, such as by linking using dual zero lash ball bushings 40, by way of non-limiting example. Also illustratively shown in FIG. 1 is a shell nest 42 upon which the curved shell 20 may be associated at various points during transfer between and during the semi-conductor processes.

Figure 2:
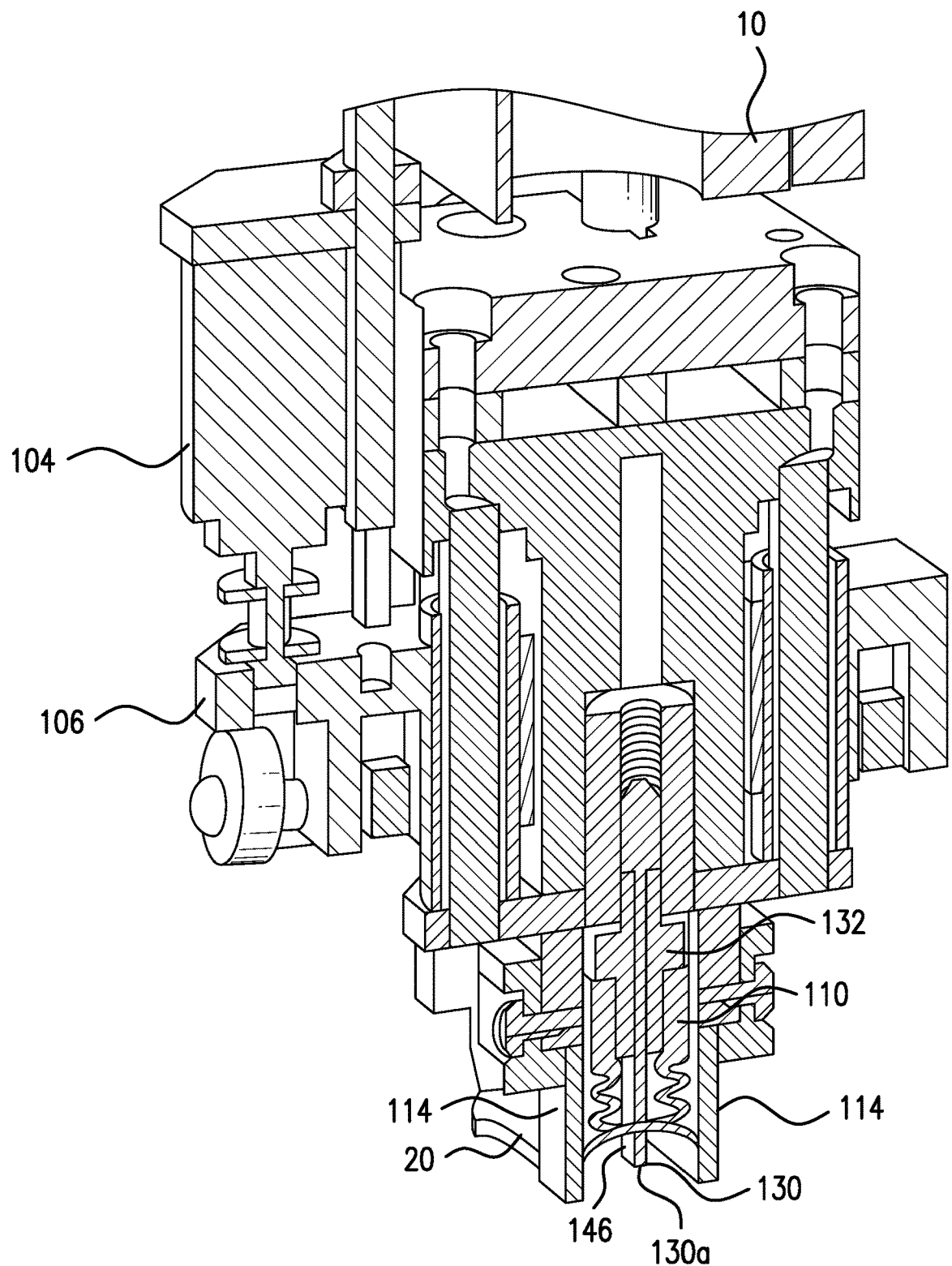
FIG. 2 illustrates the vacuum ejector pin section of an exemplary end effector.

FIG. 2 illustrates a vacuum ejector pin section 102 of an exemplary end effector 10, in a non-limiting example, such as the end effector shown in FIG. 1. As illustrated, one or more pneumatic cylinders 104 and/or moving yokes 106 may operate to move portions of end effector 10 in at least Z axis. In the illustrated embodiment of FIG. 2, a vacuum cup 110 is provided in association with the end effector 10, such that a vacuum may be applied by the vacuum cup 110 to an element 20 subjected to gripping by the end effector 10.

Further, application of the vacuum by the vacuum cup 110 may be in conjunction with application of one or more Y and/or X axis clamps 114, such as Mylar clamp shell springs 114 as illustratively shown in FIG. 2.

An exemplary ejector pin 130, or quill, is illustrated in FIG. 2, and may be at least partially retained in association with a cup fitting 132. A distal portion of the ejector pin 130 may protrude into, and in some stages of use, protrude through, an internal open-ended cavity formed by and/or at a base of the vacuum cup 110. Vacuum pressure may typically be applied to the retained element 20 at a plane associated with an outermost edge or mouth of the cavity defined at the base of the vacuum cup 110. In certain embodiments of the present invention the vacuum cup, and/or at least the base thereof, may be pliable in nature, such as to allow for variations in the surface of gripped element 20. For example, vacuum cup 110 may be formed of rubber or plastic, or of any similar material, and/or may be formed in a longitudinally (e.g., Z-axis) compressible manner, such as an "accordion" shape, by way of non-limiting example.

In certain embodiments of the present invention ejector pin 130 may include an internal opening, path, or be hollow. Ejector pin 130 may be formed of any material suitable to carry out the functionality described herein, such as providing non-damaging pressure to gripped element 20. For example, ejector pin 130 may be formed of plastic, stainless steel, or the like, by way of non-limiting example. Ejector pin 130 may have one or more vacuum ports, in the illustrated case vacuum ports 146 proximate to an end portion 130a thereof. In the illustrated embodiment, four vacuum ejector pin ports 146 are shown by way of non-limiting example only. That is, one of skill in the pertinent arts will appreciate that other numbers of ejector pin ports 146 may be provided.

Figure 3:
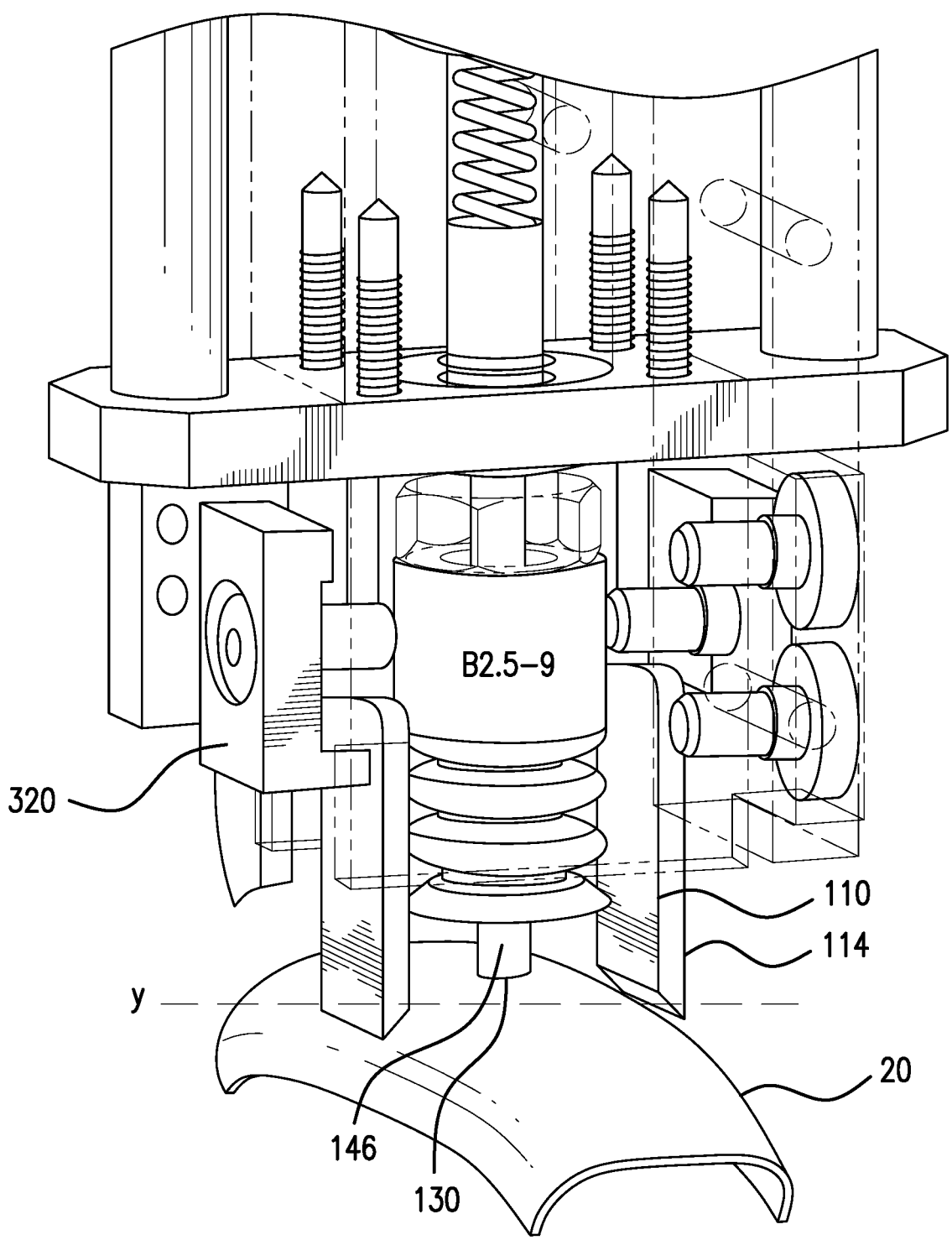
FIG. 3 illustrates a shell element in a "ready position" for association with a vacuum provided by a vacuum.

FIG. 3 illustrates an embodiment of the present invention in which a shell element 20 is in a "ready position" for association with the vacuum provided by the vacuum cup 110. In the illustration, Mylar clamp springs 114 center the complex shell geometry of the exemplary element 20 in the Y axis. Vacuum cup 110 is shown in a non-vacuum position, e.g., is shown as suspended above the shell geometry and thus before vacuum has been applied to the shell element 20. Also evident in FIG. 3 is the ejector pin 130 in physical association with a portion of the shell geometry. Various gripping and release elements for a gripped element 20 may be used, such as the quick release spring clamps 320 illustrated in FIG. 3.

Figure 4:
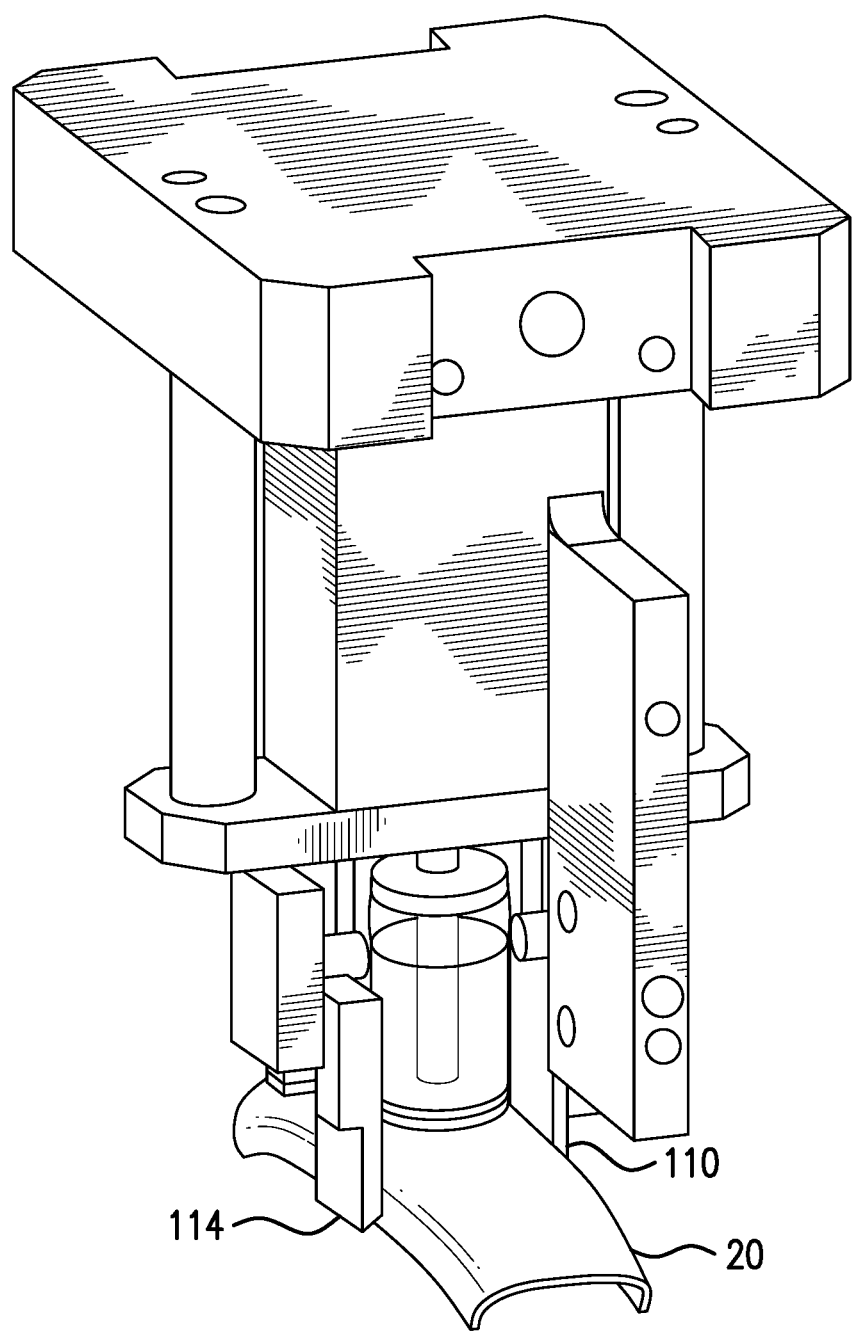
FIG. 4 illustrates an exemplary end effector with the vacuum engaged.

FIG. 4 illustrates an end effector 10 according to an embodiment of the present invention, such as the one illustratively shown in FIG. 3, but with the vacuum engaged. As illustrated, clamp springs 114 may be physically associated with the shell element 20 upon vacuum application, such as in order to center the shell element with respect to application of the vacuum. Moreover, the plane at the mouth provided by the base of the vacuum cup 110 is shown as positionally associated with the shell geometry, so as to optimally allow for application of vacuum thereto.

Figure 5:
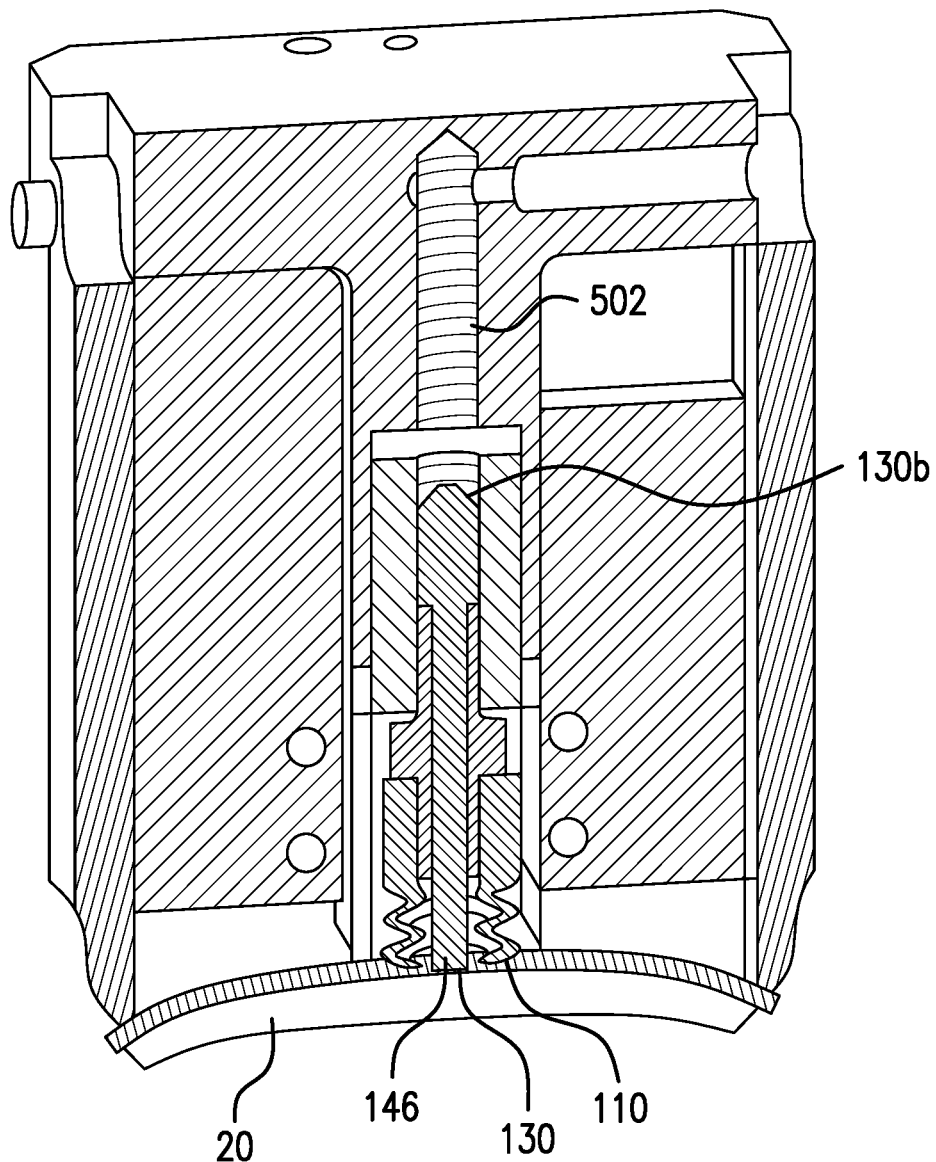
FIG. 5 illustrates an exemplary position of the vacuum cup and ejector pin as vacuum is applied to a shell element.

FIG. 5 illustrates a vacuum ejector system according to an embodiment of the present invention. There is shown an exemplary position of the vacuum cup 110 and ejector pin 130 as vacuum is applied to the shell element 20. In the illustrated case, it should be noted that the topmost portion 130b of the ejector pin 130 may be associated with a spring 502, whereby actuation of the spring 502, or actuation of a like element as will be understood to the skilled artisan, may drive the ejector pin 130 downward in the Z axis to thereby affect an efficient disassociation, by the distal tip of the ejector pin 130, of the shell element 20 from the plane provided by the mouth of the vacuum cup 110.

In certain embodiments of the invention, as the vacuum cup 110 is substantially physically associated with the shell element 20, the vacuum cup 110 may provide a seal that, when vacuum is drawn through the port or ports 146 at the tip of the vacuum ejector 130, provides a vacuum pursuant to which the shell element 20 is gripped and may be moved about. And, on the contrary, when the shell element 20 is pushed out of association with the vacuum cup 110 by the ejector 130, the vacuum seal is broken and the element 20 is released. Such a release may be swift and efficient, and even substantially immediate.

Figure 6:
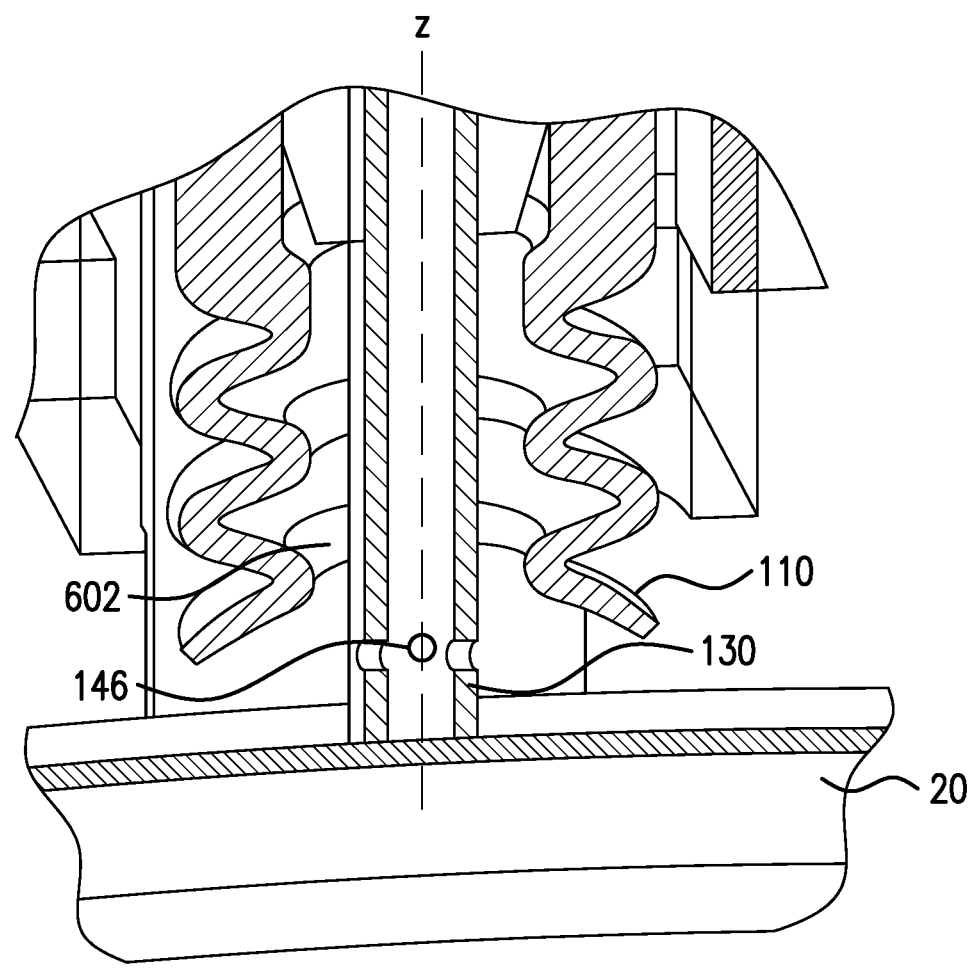
FIG. 6 provides an illustration of a cross-section of the ejector pin, vacuum cup, and shell element upon downward actuation in the Y axis of the ejector pin.

FIG. 6 provides an illustration of a cross-section of an embodiment of the ejector pin 130, vacuum cup 110, and shell element 20 upon downward actuation in the Z axis of the ejector pin 130. As shown, the breaking of the seal provided by the vacuum cup 110 with the shell element 20 by the downward movement of the ejector pin 130 exposes the vacuum ports 146 provided at the tip of the vacuum pin 130 outside of the vacuum chamber 602. Thereby, the vacuum seal (or substantial seal) provided within and by the vacuum cup 110 may be broken, and the shell element 20 may be effectively ejected from the end effector 10, by the breaking of the vacuum seal resultant from the downward movement of the pin 130.

In accordance with the foregoing, the embodiments may provide a hollow, spring-loaded, ejector pin that may be mounted centrally within a vacuum cup such that the ejector pin may be used to eject elements subjected to vacuum, such as in semi-conductor processing embodiments. More particularly, the vacuum provided may pass through ports at the tip of the ejector pin in order to complete a vacuum circuit in association with a vacuum chamber provided by a surrounding vacuum cup.

The descriptions of the disclosure are provided to enable any person skilled in the art to make or use the disclosed embodiments. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but rather is to be accorded the widest scope consistent with the principles and novel features disclosed herein. For example, while embodiments of the present invention have been described herein as they may particularly relate to semiconductor processing and semiconductor processing equipment and robotics, embodiments of the present invention may have other applications in other fields of endeavor where the use of end effectors may be useful.

What is claimed is:

1. An end effector, comprising:
   positioning clamps for positioning an element in relation to application of a vacuum force to the element;
   a vacuum cup comprising at least a pliable mouth capable of sealing to the element upon application of the vacuum force to the element via a vacuum chamber;
   an actuatable vacuum ejector pin of a length greater than, and extending along a center axis of, the vacuum chamber, comprising a plurality of vacuum ports to supply the vacuum force from via a direct connection from the actuatable vacuum pin to, and substantially distally from, a generator of the vacuum force,
   wherein actuation of the vacuum ejector pin moves the vacuum ejector pin toward the element through the vacuum chamber until the seal is broken, thereby breaking the vacuum force and ejecting the element from the vacuum cup.

2. The end effector of claim 1, wherein the positioning clamps are spring actuated.

3. The end effector of claim 1, wherein the positioning comprises centering with respect to the pliable mouth.

4. The end effector of claim 1, further comprising a robotic interface for interfacing to a moving robotic.

5. The end effector of claim 1, wherein an entirety of the vacuum cup is substantially pliable.

6. The end effector of claim 1, wherein the element comprises a curved shell element.

7. The end effector of claim 1, wherein the plurality of ports consists of two ports.

8. The end effector of claim 1, wherein the plurality of ports consists of four ports.

9. The end effector of claim 1, further comprising a vacuum force capable of providing suction through the plurality of ports.

10. The end effector of claim 1, wherein the actuation of the ejector pin comprises a spring.

11. The end effector of claim 1, wherein the positioning clamps are synchronous.

12. The end effector of claim 1, wherein the positioning clamps comprise Mylar clamp shell springs.

13. The end effector of claim 1, wherein the vacuum ejector pin is hollow.

14. The end effector of claim 1, wherein the actuatable vacuum ejector pin comprises plastic.

15. The end effector of claim 1, wherein the actuatable vacuum ejector pin comprises stainless steel.

\* \* \* \* \*